United States Patent
Imaizumi

(10) Patent No.: US 9,681,535 B2
(45) Date of Patent: Jun. 13, 2017

(54) ASSEMBLED BOARD

(71) Applicant: KYOCERA Corporation, Kyoto-shi, Kyoto (JP)

(72) Inventor: Kunio Imaizumi, Fukuchiyama (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 15/245,416

(22) Filed: Aug. 24, 2016

(65) Prior Publication Data

US 2017/0064813 A1    Mar. 2, 2017

(30) Foreign Application Priority Data

Aug. 26, 2015  (JP) ................................. 2015-166429

(51) Int. Cl.
  *H05K 1/02* (2006.01)
(52) U.S. Cl.
  CPC .................................. *H05K 1/0213* (2013.01)
(58) Field of Classification Search
  CPC ...... H05K 1/0271; H05K 1/02; H05K 1/0213; H05K 1/0209
  See application file for complete search history.

(56) References Cited

U.S. PATENT DOCUMENTS

| | | | | |
|---|---|---|---|---|
| 8,357,860 B2* | 1/2013 | Kaneko | ............. | H01L 23/49838 174/260 |
| 2006/0055432 A1* | 3/2006 | Shimokawa | .......... | H01L 21/565 327/5 |
| 2006/0163740 A1* | 7/2006 | Ohno | ................ | H01L 23/49816 257/762 |
| 2009/0294156 A1* | 12/2009 | Ueno | ...................... | H01L 23/13 174/255 |
| 2011/0076472 A1* | 3/2011 | Kim | .................. | H01L 23/49822 428/213 |
| 2015/0014020 A1* | 1/2015 | Kaneko | ................ | H05K 3/4007 174/250 |
| 2016/0021758 A1* | 1/2016 | Furutani | ................ | H05K 3/103 174/251 |

FOREIGN PATENT DOCUMENTS

JP    2013-172073 A    9/2013

* cited by examiner

*Primary Examiner* — Hoa C Nguyen
(74) *Attorney, Agent, or Firm* — Volpe and Koenig, P.C.

(57) ABSTRACT

The assembled board includes: an insulating board including a plurality of product regions disposed in a central portion and a marginal region disposed in an outer peripheral portion; a conductor layer disposed on an upper surface side and a lower surface side of the insulating board, the conductor layer having a volume different between the upper surface side and the lower surface side; and a solder resist layer laminated on the upper and lower surfaces of the insulating board, and a plurality of openings are formed in the solder resist layer on a surface on a side with a smaller volume of the conductor layer so that a volume in the marginal region of the solder resist layer becomes smaller than a volume in the marginal region of the solder resist layer on a surface on an opposite side.

4 Claims, 2 Drawing Sheets

ASSEMBLED BOARD

BACKGROUND OF THE INVENTION

1. Technical Field

The present disclosure relates to an assembled board with a high-density wiring conductor.

2. Background

A plan view and a main part enlarged cross-sectional view of the conventional assembled board B are shown in FIGS. 2A and 2B. Such an assembled board B is described, for example, in Japanese Unexamined Patent Application Publication No. 2013-172073. The assembled board B includes an insulating board 10, a conductor layer 12, and a solder resist layer 13. In a top view, the insulating board 10 includes a plurality of product regions X to be the individual wiring boards, and a marginal region Y surrounding the product regions X. Although twelve product regions X are illustrated in the assembled board B, the assembled board B actually includes several tens to several hundreds of product regions X.

In the insulating board 10, the insulating layers for the build-up 10b are laminated on the upper and lower surfaces of the insulating layer for the core 10a. A plurality of through holes 14 are formed in the insulating layer for the core 10a corresponding to the product region X. A through-hole conductor 12a including a part of the conductor layer 12 is filled inside the through hole 14. A plurality of via holes 15 are formed in the insulating layers for the build-up 10b corresponding to the product region X. A via conductor 12b including a part of the conductor layer 12 is filled inside the via hole 15.

The conductor layer 12 is formed on the surface of and inside the insulating board 10. The conductor layer 12 is formed, for example, by using a well-known plating method. Part of the conductor layer 12 formed on the upper surface of the insulating board 10 functions as the semiconductor-element connection pad 16. The electrode of the semiconductor element is connected to the semiconductor-element connection pad 16 through the solder. Part of the conductor layer 12 formed on the lower surface of the insulating board 10 functions as the external connection pad 17. The wiring conductor of the external electric circuit board is connected to the external connection pad 17 through the solder.

This causes the semiconductor element and the external electric circuit board to connect each other electrically, and causes the semiconductor element to be activated by transmission and reception of electrical signals through the conductor layer 12. The insulating board 10 where the conductor layer 12 is formed has a coefficient of thermal expansion of about 10 to 20 ppm/° C.

The solder resist layer 13 is formed on the upper and lower surfaces of the insulating board 10. The solder resist layer 13 formed on the upper surface includes the opening 13a exposing the central portion of the semiconductor element connection pad 16. The solder resist layer 13 formed on the lower surface includes the opening 13b exposing the central portion of the external connection pad 17. The resin paste or film, for example, formed of electrically insulating materials is applied or adhered onto the surface of the insulating layer for the build-up 10b to be thermally cured, whereby the solder resist layer 13 is formed. The solder resist layer 13 has a thickness of about 15 to 20 μm. The solder resist layer 13 has a coefficient of thermal expansion of about 60 ppm/° C.

By the way, as described above, when the solder resist layer 13 is heated to be cured, a stress due to the contraction of the solder resist layer 13 occurs on the upper surface side and the lower surface side of the insulating board 10 due to the difference in coefficients of thermal expansion between the insulating board 10 and the solder resist layer 13. In such a state, for example, when the volume of the conductor layer 12 on the upper surface side of the wiring board 10 is smaller than the volume of the conductor layer 12 on the lower surface side of the wiring board 10, the stiffness on the upper surface side of a smaller volume of the conductor layer 12 becomes small as compared to the stiffness on the lower surface side. Therefore, the assembled board B sometimes warps to the upper surface side due to the contraction stress of the solder resist layer 13.

In particular, in the corner portion of the assembled board B in a position away from the central portion of the assembled board B, the stress is large, and there is a tendency for the upward warpage to increase. For this reason, when a semiconductor element is mounted on the assembled board B, the height of the semiconductor-element connection pad becomes uneven. As a result, there is a problem that the electrode of the semiconductor element and the semiconductor-element connection pad cannot be fully joined through the solder, and that the semiconductor element cannot be stably operated.

SUMMARY

The assembled board of the present disclosure includes: an insulating board including a plurality of product regions disposed in a central portion and a marginal region surrounding the central portion, the marginal region disposed in an outer peripheral portion; a conductor layer disposed on an upper surface side and a lower surface side of the insulating board corresponding to the product regions and the marginal region, the conductor layer having a volume different between the upper surface side and the lower surface side; and a solder resist layer laminated from the central portion to the outer peripheral portion of the upper and lower surfaces of the insulating board, and a plurality of openings are formed in the solder resist layer on a surface on a side with a smaller volume of the conductor layer so that a volume in the marginal region of the solder resist layer becomes smaller than a volume in the marginal region of the solder resist layer on a surface on an opposite side.

DETAILED DESCRIPTION

In the assembled board of the present disclosure, a plurality of openings are formed in the solder resist layer on a surface on a side with a smaller volume of the conductor layer so that a volume in the marginal region of the solder resist layer becomes smaller than a volume in the marginal region of the solder resist layer on a surface on an opposite side. For this reason, the stress at the time of contraction of the solder resist layer can be reduced on the side of a smaller volume of the conductor layer and smaller stiffness. Thus, the warpage of the assembled board is reduced so that the electrode of the semiconductor element and the semiconductor-element connection pad are reliably joined, whereby the assembled board allowing the semiconductor element to operate stably can be provided.

Figure 1A:
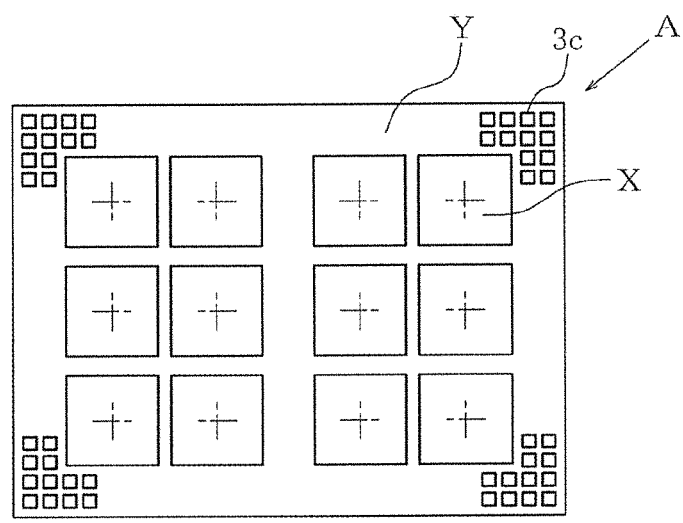
FIGS. 1A and 1B are respectively a schematic plan view and a main part enlarged cross-sectional view showing the assembled board according to an embodiment of the present disclosure.

The assembled board according to one embodiment of the present disclosure will be described with reference to FIGS. 1A and 1B. The assembled board A shown in FIG. 1A includes an insulating board 1, a conductor layer 2, and a solder resist layer 3. In a top view, the insulating board 1 includes a plurality of product regions X to be the individual wiring boards, and a marginal region Y surrounding the product regions X.

Figure 1B:
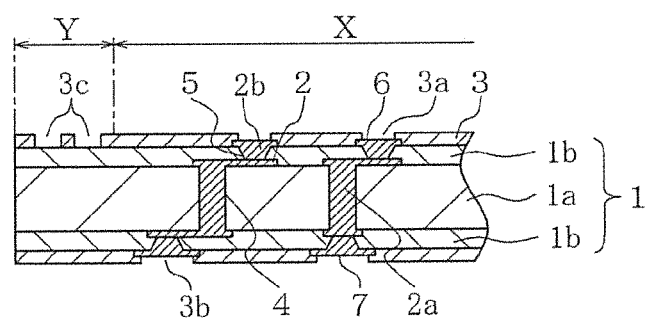
Figure 2A:
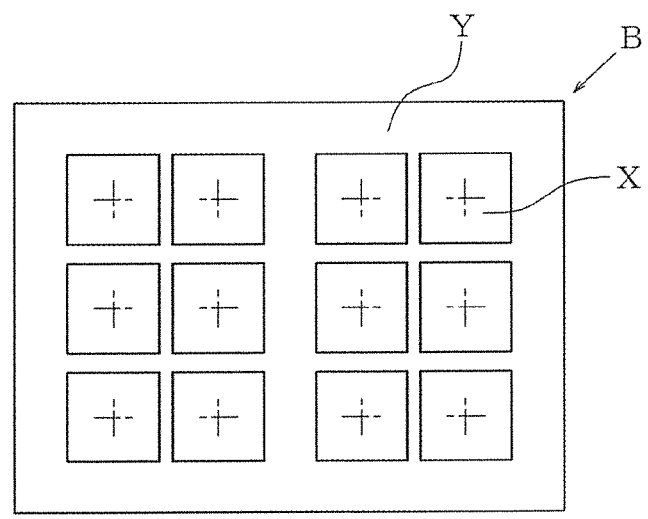
FIGS. 2A and 2B are respectively a schematic plan view and a main part enlarged cross-sectional view showing the conventional assembled board.
Figure 2B:
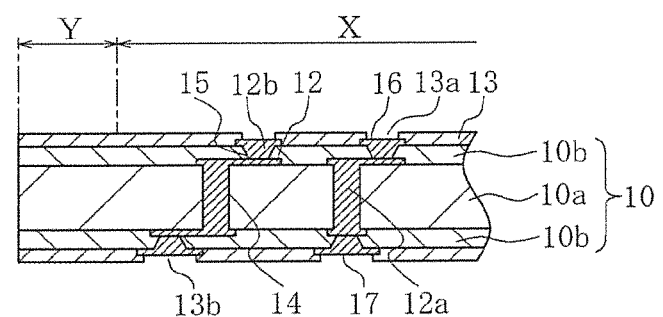

As shown in FIG. 1B, the insulating board 1 includes a structure where the insulating layers for the build-up 1*b* are laminated on the upper and lower surfaces of the insulating layer for the core 1*a*. The insulating layers 1*a* and 1*b* are formed of electrically insulating material where the glass cloth is impregnated with an insulating resin such as an epoxy resin or a bismaleimide triazine resin so as to be cured.

As shown in FIG. 1B, the insulating layer for the core 1*a* includes a plurality of through holes 4 in the product region X. A through-hole conductor 2*a* including a part of the conductor layer 2 is formed inside the through hole 4. The through hole 4 is formed, for example, by drill processing or blast processing, and has a diameter of about 50 to 300 µm.

As shown in FIG. 1B, the insulating layer for the build-up 1*b* includes a plurality of via holes 5 in the product region X. A via conductor 2*b* including a part of the conductor layer 2 is formed inside the via hole 5. The via hole 5 is formed, for example, by laser processing, and has a diameter of about 30 to 100 µm.

The conductor layer 2 is formed of a highly conductive metal such as copper on the surface of and inside the insulating board 1, for example, by the well-known semi-additive method or subtractive method. The conductor layer 2 has a thickness of about 15 to 20 µm. In the assembled board A according to the one embodiment, the volume of the conductor layer 2 disposed on the upper surface side of the insulating board 1 is smaller than the volume of the conductor layer 2 disposed on the lower surface side of the insulating board 1.

Part of the conductor layer 2 formed on the upper surface of the insulating board 1 functions as the semiconductor-element connection pad 6. The electrode of the semiconductor element is connected to the semiconductor-element connection pad 6 through the solder. Part of the conductor layer 2 formed on the lower surface of the insulating board 1 functions as the external connection pad 7. The wiring conductor of the external electric circuit board is connected to the external connection pad 7 through the solder. This causes the semiconductor element and the external electric circuit board to connect each other electrically, and causes the semiconductor element to be activated by transmission and reception of electrical signals through the conductor layer 2.

The solder resist layer 3 is formed by deposition or application followed by thermal curing of an electrically insulating sheet or a paste containing a thermosetting resin such as an epoxy resin or a polyimide resin on the upper and lower surfaces of the insulating board 1. The solder resist layer 3 formed on the upper surface includes the opening 3*a* exposing the central portion of the semiconductor-element connection pad 6. The solder resist layer 3 formed on the lower surface includes the opening 3*b* exposing the central portion of the external connection pad 7.

The solder resist layer 3 formed on the surface on the side of a smaller volume of the conductor layer 2, that is, the upper surface of the insulating board 1 has a plurality of openings 3*c* so that the volume in the marginal region Y is smaller than the volume in the marginal region Y of the solder resist layer 3 on the opposite side. The length of one side of the opening 3*c* is usually greater than 0.1 mm from the limit of manufacture. As shown in FIG. 1A, the opening 3*c* is disposed in the corner portion of the marginal region Y.

According to the assembled board A according to the one embodiment of the present disclosure, a plurality of openings 3*c* are formed in the solder resist layer 3 on the surface on the side of a smaller volume of the conductor layer 2 so that the volume in the marginal region Y of the solder resist layer 3 becomes smaller than the volume in the marginal region of the solder resist layer 3 on the surface on the opposite side. For this reason, the stress at the time of contraction of the solder resist layer 3 can be reduced on the side of a smaller volume of the conductor layer 2 and smaller stiffness. In particular, when the opening 3*c* is disposed in the corner portion of the marginal region Y, the stress can be reduced more effectively. Thus, the warpage of the assembled board A is reduced so that the electrode of the semiconductor element and the semiconductor-element connection pad 6 are reliably joined, whereby the assembled board allowing the semiconductor element to operate stably can be provided.

The present disclosure is not limited to the above embodiments, and various modifications are possible without departing from the scope of the present disclosure. For example, in the assembled board A according to the one embodiment described above, as shown in FIGS. 1A and 1B, the openings 3*c* have an equal-sized quadrangular shape. However, each of the openings 3*c* may have a different size. Furthermore, the opening 3*c* may have other shapes such as polygonal shapes such as a triangular shape, a pentagonal shape, and a hexagonal shape, circular shapes, and oval shapes, and various shapes may be mixed.

In the assembled board A according to the one embodiment described above, as shown in FIGS. 1A and 1B, the opening 3*c* is disposed in the corner portion of the marginal region Y. However, if disposed in the marginal region, the opening does not necessarily need to be disposed in the corner portion of the marginal region.

In the assembled board A according to the one embodiment described above, as shown in FIGS. 1A and 1B, the insulating board 1 has a quadrangular shape. However, the insulating board may have another shape such as a polygonal shape such as a triangular shape, a pentagonal shape, and a hexagonal shape, a circular shape, and an oval shape.

Furthermore, in the assembled board A according to the one embodiment described above, as shown in FIGS. 1A and 1B, a plurality of product regions X are arranged lengthwise and breadthwise. However, the product region may not necessarily be arranged lengthwise and breadthwise, and the product region may be arranged depending on the shape of, for example, the insulating board.

What is claimed is:

1. An assembled board comprising:
    an insulating board including a plurality of product regions disposed in a central portion and a marginal region surrounding the central portion, the marginal region disposed in an outer peripheral portion;
    a conductor layer disposed on an upper surface side and a lower surface side of the insulating board corresponding to the product regions and the marginal region, the conductor layer having a volume different between the upper surface side and the lower surface side; and a solder resist layer laminated from the central portion to the outer peripheral portion of the upper and lower surfaces of the insulating board, wherein a plurality of openings are formed in the solder resist layer on a surface on a side with a smaller volume of the conductor layer so that a volume in the marginal region of the solder resist layer becomes smaller than a volume in the marginal region of the solder resist layer on a surface on an opposite side.

2. The assembled board according to claim 1, wherein the insulating board has a quadrangular shape.

3. The assembled board according to claim 2, wherein the plurality of product regions are arranged lengthwise and breadthwise.

4. The assembled board according to claim 2, wherein the openings are formed in a corner portion of the marginal region.

* * * * *